(12) United States Patent
Divakaruni et al.

(10) Patent No.: US 6,870,211 B1
(45) Date of Patent: Mar. 22, 2005

(54) SELF-ALIGNED ARRAY CONTACT FOR MEMORY CELLS

(75) Inventors: Rama Divakaruni, Ossining, NY (US); Johnathan E. Faltermeier, LaGrangeville, NY (US); Michael Maldei, Durham, NC (US); Jay Strane, Chester, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/605,590

(22) Filed: Oct. 10, 2003

(51) Int. Cl.[7] ............................................. H01L 27/108
(52) U.S. Cl. .................... 257/298; 257/295; 257/301; 257/305; 257/306; 257/307
(58) Field of Search ................................ 257/301, 305, 257/306, 307, 295

(56) References Cited

U.S. PATENT DOCUMENTS 6,262,450 B1 * 7/2001 Kotecki et al. ............. 257/306
6,570,208 B2    5/2003 Mandelman et al.
6,600,183 B1 * 7/2003 Visokay et al. ............. 257/295
6,737,316 B2 * 5/2004 Lee ............................ 438/244
2002/0196651 A1  12/2002 Weis

* cited by examiner

Primary Examiner—David Nelms
Assistant Examiner—Mai-Huong Tran
(74) Attorney, Agent, or Firm—Steven Capella; Daryl Neff

(57) ABSTRACT

A method of forming bitlines for a memory cell array of an integrated circuit and conductive lines interconnecting transistors of an external region outside of the memory cell array is provided. The method includes patterning troughs in a dielectric region covering the memory cell array according to a first critical dimension mask. Bitline contacts to a substrate and bitlines are formed in the troughs. Thereafter, conductive lines are formed which consist essentially of at least one material selected from the group consisting of metals and conductive compounds of metals in horizontally oriented patterns patterned by a second critical dimension mask, wherein the conductive lines interconnect the bitlines to transistors of external circuitry outside of the memory cell array, the conductive lines being interconnected to the bitlines only at peripheral edges of the memory cell array.

8 Claims, 7 Drawing Sheets

SELF-ALIGNED ARRAY CONTACT FOR MEMORY CELLS

BACKGROUND OF INVENTION

The present invention relates to the structure and fabrication of integrated circuits, especially integrated circuits including memory.

As the minimum size for defining features of an integrated circuit (also referred to as the "groundrule") shrinks from one generation to the next, the tolerances for performing the various processes in fabricating an integrated circuit become tighter. While some features of an integrated circuit can be readily shrunk in proportion to the reduced groundrule, other features cannot. With each reduction in the groundrule, the properties of particular processes and materials limit the ability to construct certain features at reduced sizes.

This challenge particularly impacts the design of dynamic random access memories (DRAMs) and integrated circuits having both logic circuits and embedded DRAMs. DRAMs are generally designed to the smallest groundrule, in order to provide maximum data storage capacity within very small integrated circuit area. The structure of a conventional DRAM 10 is illustrated in top-down (plan) view in FIG. 1. The DRAM includes a memory cell array 12 having memory cells each including a transistor formed in a semiconductor substrate and a storage capacitor (not shown in FIG. 1). As used herein, the term "horizontal" means in a direction parallel to the major surface of the semiconductor substrate. As shown in FIG. 1, the DRAM 10 includes wordlines (e.g. wordlines W1, W2, . . . Wn) which run in a first horizontal direction over a memory array 12. The wordlines typically include conductor portions including polysilicon and/or a metal and/or a metal silicide. The wordline typically is encapsulated with an insulator, i.e. having an insulating cap above the conductor and insulating spacers formed on sidewalls of the conductor. Bitlines, e.g. bitlines B1, . . . Bn, run over the memory array 12 in a second horizontal direction transverse to the wordlines.

Transistors of the memory cell array are operated by the wordlines. The transistors of a row of memory cells are turned on by a certain wordline. Pairs of bitlines then carry signals representative of data bits between the memory cells of which the transistors are turned on and sense amplifiers 140 through 142. As shown in FIG. 1, the pairs of bitlines are connected to sense amplifiers which alternate between a first external region 14 which is disposed near a first edge of the memory array 12 and a second external region 16 which is disposed near a second edge of the memory array 12. For example, a pair of bitlines B1, B2 carry signals between a pair of memory cells and a sense amplifier 140 located in region 14. A pair of bitlines B3, B4 carry signals between a pair of memory cells and a sense amplifier 141 located in region 16. A pair of bitlines Bn-1, Bn carry signals between a pair of memory cells and a sense amplifier 142 located in region 14.

Bitlines are connected to each memory cell through a contact 18 to the substrate. The bitline contact 18 is a vertically oriented conductive structure that contacts a transistor drain region formed in the substrate. The bitline is formed through an opening between two adjacent wordlines, e.g W1, and W2. Typically, the bitline contacts 18 are formed in a borderless manner to the wordlines by etching selective to the material of the insulating cap and spacers and depositing polysilicon and/or a metal silicide to fill the resultant opening.

Conventionally, bitlines and bitline contacts in advanced DRAMs are formed by two patterning processes. A critical dimension mask is used to define patterns for forming the bitline contacts in the array region 12. The patterns produced by the first patterning process can include only via patterns or they can be line-space patterns. Heavily doped polysilicon or other suitable conductor is deposited in the via patterns and/or line patterns to form the bitline contacts between encapsulated wordlines. If line patterns are formed in the first process, a linearly extending lower layer of polysilicon may also be formed on the bitline contacts as a lower layer of the bitlines. Thereafter, an interlevel dielectric layer is deposited.

Conventionally, to form the second pattern level, a second critical dimension mask is used to define the locations for forming first level horizontally oriented conductive lines in both the memory array region 12 and in the external regions 14 and 16 outside of the memory array region 12. In the memory array region, these conductive lines are formed either as bitlines or as upper metal layers of bitlines. Patterning the conductive lines of the external regions and the memory cell array area with the same mask ensures that the conductive lines interconnect the memory array region to the external regions.

However, it is not possible with normal techniques to fabricate the second patterns by the second critical dimension mask in perfect alignment with the lower level bitline contact patterns and/or lower bitline layer patterns that are formed by the first critical dimension mask. As the groundrule is reduced from one technology generation to the next, this problem worsens. FIG. 1B is a top-down view illustrating the overlay of the metal patterns 20 in the array area 12 relative to the bitline contacts 18 and/or lower bitline layer 22. When the groundrule is very small, e.g. in the neighborhood of 100 nm and smaller, it becomes impossible to overlay the metal patterns 20 in alignment with the bitline contacts 18. As shown in FIG. 1B, the metal patterns 20 are somewhat misaligned with the bitline contacts 18 and lower bitline layer 22. This results in small spacing 24 between bitline contact (CB) 18 and the metal pattern 20. As the groundrule is decreased, potential misalignment increases, such that the spacing 24 decreases to the point where the metal pattern 20 for a bitline, e.g. bitline B2, touches the bitline contacts 18 and/or lower bitline layer 22 of a neighboring bitline such as bitline B1. Such misalignment results in complete failure of the memory array region, requiring the integrated circuit to be discarded. Misalignment to smaller degrees can degrade the devices by introducing higher contact resistivities.

FIG. 2 illustrates worst case overlay results between bitline contacts (CB) and the first level metal patterns (M0) which form the upper layer of bitlines, as formed according to the conventional process described above. FIG. 2 illustrates the worst cases which result when the processes used to form the bitline contacts and the first level metal patterns are performed under worst conditions within processing tolerances. In FIG. 2, the positive numbers on the vertical axis represent the spacing which separates a particular CB pattern from an M0 pattern that are out of alignment. Ideally, each CB pattern should line up perfectly with the same M0 pattern. Misalignment results in these patterns failing to line up. Negative numbers indicate overlap between a CB pattern and the adjacent M0 pattern. The horizontal axis is in the direction of decreasing minimum feature size, i.e. the groundrule. The data points indicated by circular markers are for processing without etch bias. The data points indicated by triangular markers are for processing when etch bias is used.

As indicated in FIG. 2, under worst case processing conditions, the CB pattern and the adjacent M0 pattern begin to overlap when the groundrule is decreased below about 150 nm. For example, when the groundrule is 100 nm, the overlap between CB and adjacent M0 is potentially up to about 30 nm when no etch bias is applied and potentially as high as 50 nm when etch bias is applied.

Therefore, it is apparent that the prior art methods result in overlay error between bitline contacts and/or a lower bitline layer formed by a first critical dimension mask and the metal patterns formed by a separate critical dimension mask. As the groundrule is decreased, such overlay error has a greater and more destructive impact on processing.

Accordingly, it would be desirable to eliminate the overlay error between bitline contact patterns and/or lower layer bitline patterns and metal layer bitline patterns that are formed thereon.

It would further be desirable to provide a process for defining metal layer bitline patterns by the same critical dimension mask that is used to form the bitline contacts and/or lower layer bitline patterns.

It would further be desirable to provide a process for defining first level horizontal metal lines of the external regions by a second critical dimension mask that is different from that used to define the metal layer bitline patterns of the memory array region.

In addition, it would be desirable to provide a process by which improved interconnections are formed between the bitlines of a memory array region and regions external to the memory array.

SUMMARY OF INVENTION

A method of forming bitlines for a memory cell array of an integrated circuit and conductive lines interconnecting transistors of an external region outside of the memory cell array is provided. The method includes patterning troughs in a dielectric region covering the memory cell array according to a first critical dimension mask. Bitline contacts to a substrate and bitlines are formed in the troughs. Thereafter, conductive lines are formed which consist essentially of at least one material selected from the group consisting of metals and conductive compounds of metals in horizontally oriented patterns patterned by a second critical dimension mask, wherein the conductive lines interconnect the bitlines to transistors of external circuitry outside of the memory cell array.

BRIEF DESCRIPTION OF DRAWINGS

FIGS. 3 through 10B are cross-sectional views illustrating structures and stages in processing according to an embodiment of the invention.

DETAILED DESCRIPTION

Figure 3:
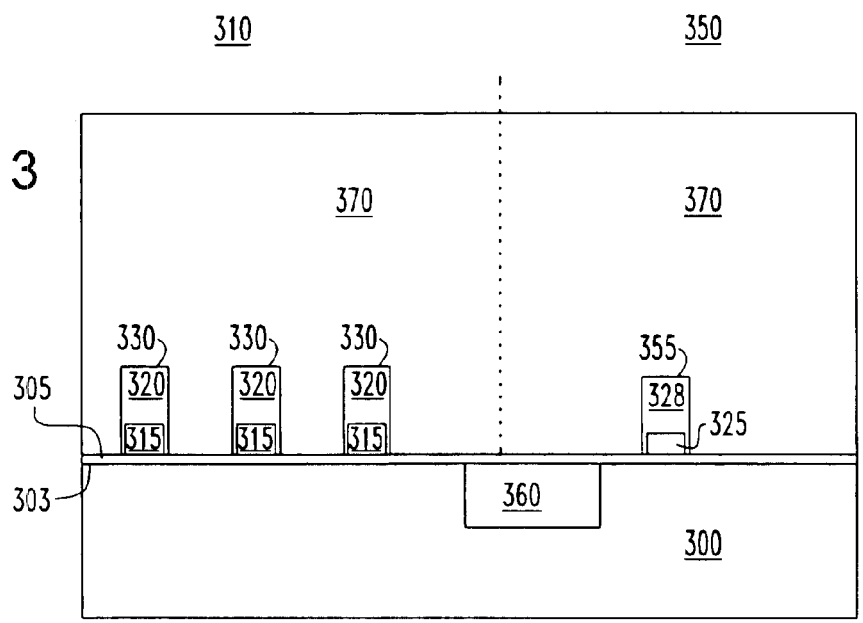

FIG. 3 illustrates an initial stage in processing according to an embodiment of the invention. As shown in FIG. 3, a substrate 300 is provided, over which a dielectric layer 305 and other structures are formed. As used herein, the term "substrate" means any region of single-crystal semiconductor material in which transistors are commonly formed. The substrate employed in the present invention can include any semiconducting material, including, but not limited to: Si, Ge, SiGe, GaP, InAs, InP and all other III/V compound semiconductors. The substrate may also be composed of a layered semiconductor such as Si/SiGe, Si/SiO$_2$/Si or silicon-on-insulator (SOI) or other semiconductor-on-insulator having a single-crystal semiconductor region as an uppermost layer. The substrate may be of n-type or p-type conductivity depending on the type of device or devices to be fabricated.

The substrate may contain various isolation regions such as shallow trench isolation (STI) regions, LOCOS (local oxidation of silicon) regions or other like isolation regions either formed in the substrate or on a surface thereof. The substrate 300 and the structures formed over the substrate 300 are divided into a memory array region 310 and an external circuitry region 350. An isolation structure 360 is provided in the substrate 300 where the memory array region 310 meets the external region 350. The isolation structure can be a trench isolation region, for example, or less preferably, a field oxide formed by LOCOS.

As further shown in FIG. 3, a plurality of encapsulated conductors 330 are provided in the memory array region 310 which run in a first horizontal direction (i.e. in a direction into and out of the page) over a major surface 303 of a single-crystal semiconductor region of the substrate 300. Each encapsulated conductor 330 includes a conductor 315 and insulative material 320 formed over the conductor 315 and on sidewalls of the conductor 315. The insulative material 320 can be a dielectric such as, but not limited to silicon nitride and/or silicon dioxide and/or silicon oxynitride. The insulative material 320 is preferably silicon nitride to provide etch selectivity in later processing steps relative to a interlevel dielectric layer 370 deposited over the encapsulated conductors 330 when such dielectric layer 370 includes silicon dioxide.

The encapsulated conductors 330 can be both wordlines and gate conductors of a memory array, when the channel regions of transistors of the memory array are oriented in a direction parallel to the major surface of the substrate. In such case, the dielectric layer 305 is a gate dielectric. Alternatively, the conductors 330 can be only wordlines of a memory array, as connected to gate conductors of transistors having vertically oriented channels formed below the major surface of the substrate. In such case, dielectric layer 305 is an array top oxide rather than a gate dielectric. Also in such case, only some of the conductive lines 330 can contact memory cells as wordlines in a particular cross-section of the memory array region 310. Other conductive lines may only be "passing conductors" having no interconnection within the cross-section shown in FIG. 3 to memory cells.

The external region 350 includes one or more gate conductors 355 as well, shown here as an encapsulated gate conductor having a conductor 325 and insulative material 328 formed on the top and sides thereof. Such encapsulation is provided in the external region 350 according to a preferred embodiment. In an alternative embodiment, the encapsulation is not present or may only be present on sidewalls but not on top of the conductor 325. As shown in FIG. 3, an interlevel dielectric layer (ILD) 370 is formed over and between conductors 330 and 355.

Figure 4:
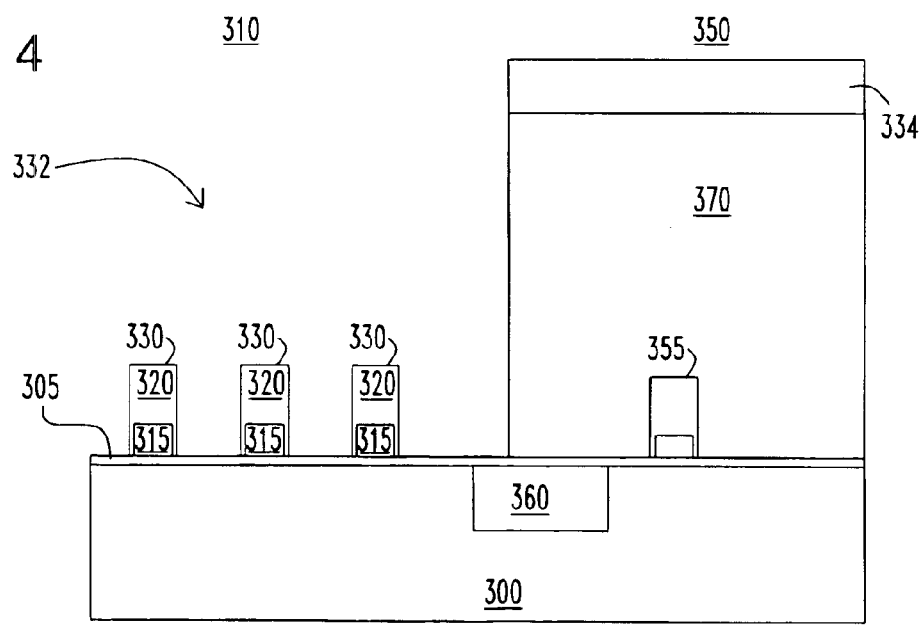

Referring to FIG. 4, processing is now performed to begin forming the bitline contacts and bitlines in the memory array region 310. Processing includes defining line-space patterns in a photoresist layer 334 above the memory array region 310 with a first critical dimension mask. The line-space patterns are used to etch troughs in the ILD 370 which extend at least to the dielectric layer 305. Etching is conducted preferably by a reactive ion etch (RIE) which etches preferentially in the vertical direction. Such etch is conducted selective to the insulative material 320 that encapsulates the conductors 315. For example, when the ILD 370 consists essentially of an oxide, the insulative material 320 can consist essentially of a nitride such as silicon nitride, and the etch be performed selective to the (silicon) nitride. During such etch, the external region 350 is protected from erosion by a layer of material such as the photoresist 334 used to form the line-space patterns in the memory array region 310.

One such trough 332 is illustrated in the cross-section of FIG. 4 by the absence of ILD 370 on the left hand side of the figure. Note that in different cross-sections, the ILD 370 is present in the memory array region 310, both in front of and behind the cross-section shown in FIG. 4. Such trough 332 may extend only to the level of the dielectric layer 305 where such dielectric layer 305 is to remain as an array top oxide, for example, where trough 332 lands on array top oxide 305 adjacent to a passing conductor of a vertical device DRAM array. The troughs extend to contact the substrate 300 in areas where bitline contacts are to be formed. Such result may be accomplished by the nature of the dielectric layer 305 itself which may be locally thin in places where bitline contacts are to be formed and thicker in other places, e.g. locations of array top oxide.

Figure 5:
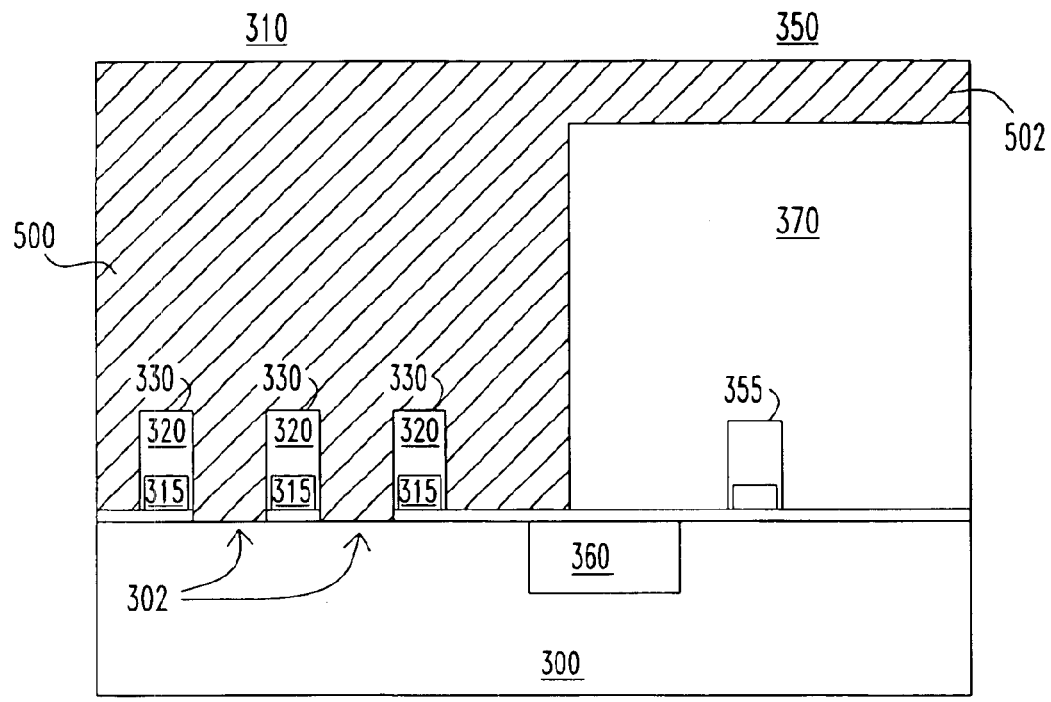

Next, as illustrated in FIG. 5, a first material is deposited over the structure to fill the trough 332 and form layer 500 as shown having overfill 502 above the dielectric region 370 in the external region and the memory array region. This layer 500 contacts the substrate 300 in the gaps 302 between the encapsulated conductors 330, thus forming bitline contacts. Layer 500 can be heavily doped polysilicon, or alternatively, can include one or more other conductive metals such as metals or conductive compounds of metals, e.g. metal silicides.

Thereafter, the layer 500 is etched back to remove the overfill 502 from the top of the ILD 370 in the external region 350 and in places where the overfill covers the ILD 370 in the memory array region 310. Etch back is typically performed by an isotropic etch process selective to the deposited conductive material in the trough 332.

Figure 6:

In order to permit subsequent processing to proceed, layer 500 need only be etched back to such extent that the overfill 502 is cleared from the top surface of the ILD 370 in the external region 350 and memory array region 310. In practice, reasons often exist for etching back layer 500 to a greater extent. Referring to FIG. 6, in an embodiment of the invention, layer 500 is etched back such that it is recessed to a level 600 which is at or below the top surface of the encapsulated conductors 330, and bitline contacts 602 remain between conductors 330. Recessing layer 500 to such extent is favored when the bitline contact material is polysilicon because polysilicon, even when heavily doped, is much less conductive than metals and conductive compounds of metals, e.g. metal silicides, from which layer 500 can be formed.

Figure 7:
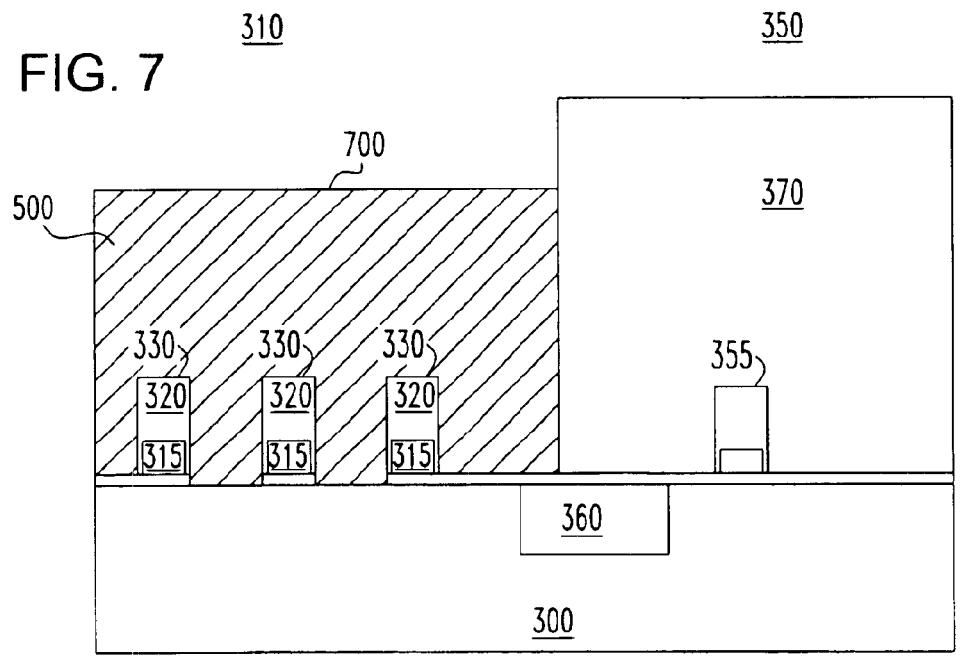

FIG. 7 illustrates another alternative in which layer 500 is recessed to a level 700 which is lower than a top surface of ILD 370. As described above, layer 500 need only be recessed to an extent at which the top surface of ILD 370 is cleared of the conductive material so as to prevent shorting between the conductive lines 500 formed in the troughs. This alternative is favored when the conductive material is a metal or compound of metal. Typically, this results in the layer 500 being recessed to a level 700 at least somewhat below the top surface of the ILD. In a particular embodiment, the conductive material is recessed to the same level as the ILD 370.

Figure 8:
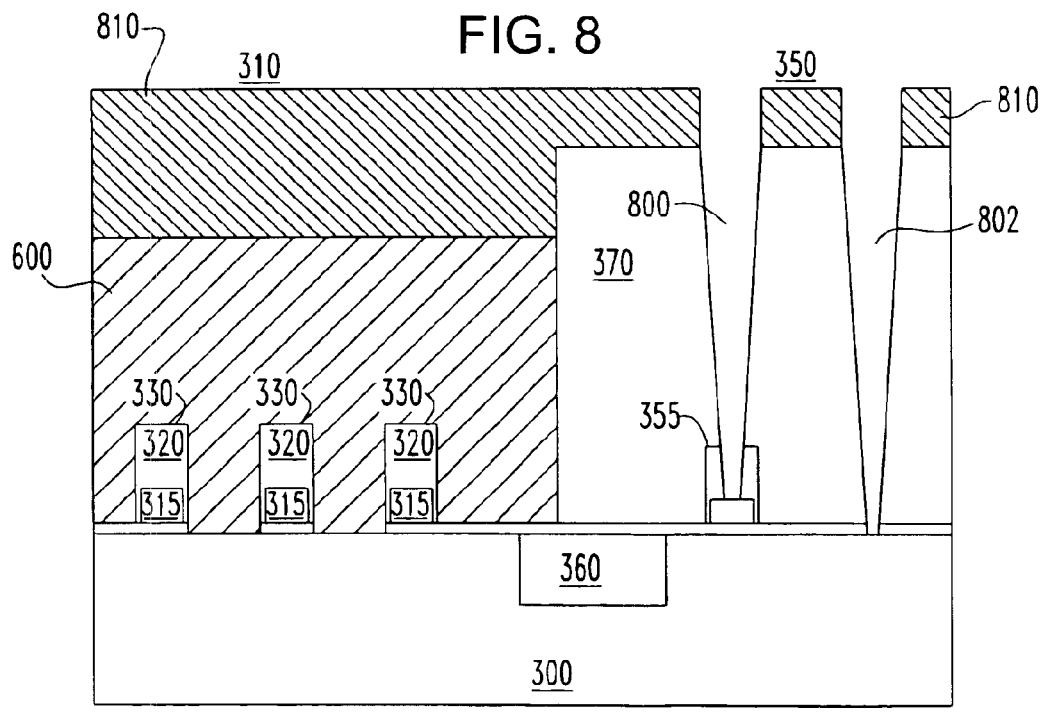

Thereafter, as shown in FIG. 8, further processing is performed to pattern vertically extending contact holes or "vias" in the external region 350. Such vias include vias 800 for forming interconnections between gate conductors 355 of transistors in the external region 350. Also included are vias 802 which extend to the substrate 300 which are used to form interconnections to source or drain regions of the transistors which are disposed in the substrate 300. To perform such processing, a layer of photoresist 810 is deposited over the structure as shown and patterned by a critical dimension mask. The ILD 370 is then etched according to the photoresist patterns to form the vias 800, 802 as shown.

Figures 9, 10A:
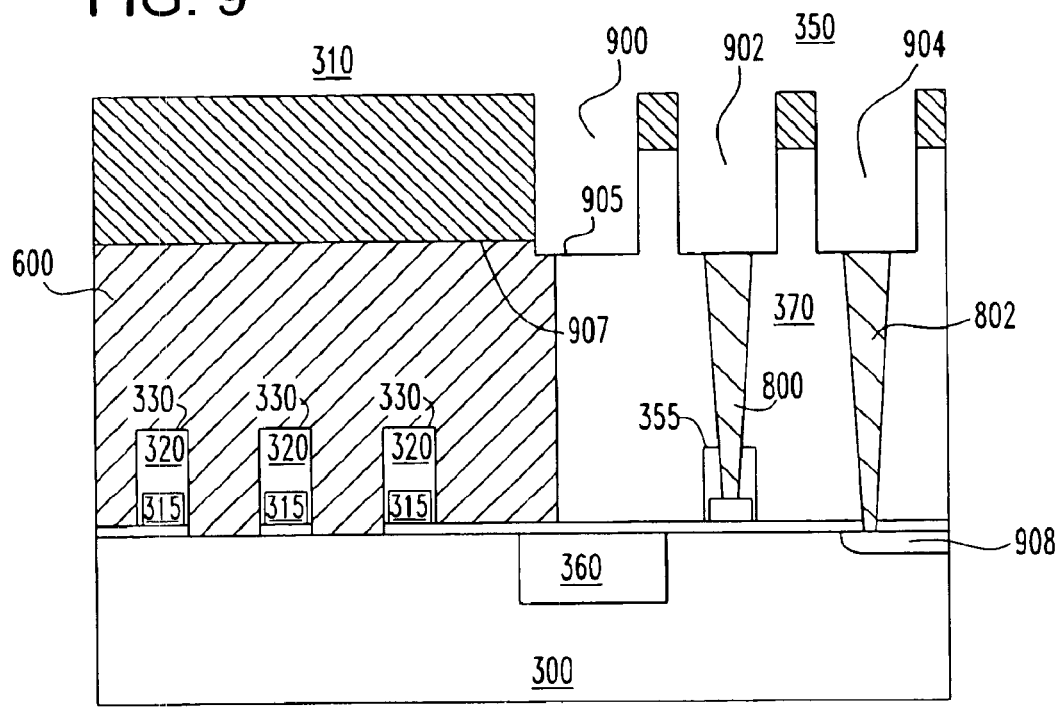

Thereafter, as shown in FIG. 9, further processing is performed to define horizontally extending conductive patterns in the ILD 370 in contact with the vias 800 and 802 and the metallic bitline layer 600. With reference to FIGS. 9 and 10A, a damascene process is utilized to form the horizontally extending conductive patterns. Damascene processing means etching a trough in a dielectric material and thereafter filling the trough with a conductive material to form a conductive line or conductive interconnect pattern. Damascene processing is especially well-suited to dense DRAM circuit technology in which large numbers of devices are packed tightly into an area of an integrated circuit. As feature sizes become smaller, the cross-section of conductive lines shrinks but often without reducing the length of the lines, such that higher resistance results. Consequently, resistance must be managed carefully. Damascene processing provides more exact dimensional control over small geometries, thereby helping to keep resistance within limits.

In this process, a second critical dimension mask, separate from that used to pattern troughs for the bitline, is used to define the troughs 900, 902, and 904 in the upper part of the ILD 370. In a later step, as shown in FIG. 10A, conductive material will be deposited in the troughs to form conductive lines. The troughs 900, 902 and 904 extend in a horizontal direction which is transverse to the cross-section that is illustrated in FIG. 9. Stated another way, the troughs extend in a direction into and out of the page in FIG. 9. A first trough 900 is formed in an overlay region 900 disposed above the isolation region 360. Trough 900 is etched at least to the level of the metallic layer 600 of bitlines of the memory array region 310. When filled, trough 900 provides conductive interconnection to horizontally extending conductive patterns of the external region, which, in turn, are conductively interconnected to transistor gate contacts and substrate contacts in the external region 350. Forming the trough 900 in the overlay region above the isolation region 360 helps to assure that a conductive pattern formed in the trough 900 thereafter will not unintentionally provide a conductive path to other elements of the integrated circuit such as transistors which are disposed in the substrate 300. Trough 900 is wider than each trough 332 that was formed in the ILD 370 in the memory array region 310 so as to assure good contact between the metal conductive patterns of the external region 350 and the bitlines 600 that are formed in the memory array region 310. Trough 900 is also overetched relative to the top of the bitlines 600 such that the bottom 905 of each trough 900 is lower than the top 907 of each bitline to assure that the metal interconnection that is formed later in the trough 900 provides good interconnection to the bitline 600.

In addition to trough 900, troughs 902 and 904 are simultaneously formed in the ILD 370 in the external region 350 when the trough 900 is formed. When later filled with a conductor, trough 902 interconnects the gate 355 of a transistor of the external region 350 to another element of the integrated circuit. On the other hand, trough 904 interconnects a source, drain or channel region 908 (e.g. as a body contact) of a transistor formed in the substrate with another element of the integrated circuit. For example, a CMOS latch or flip-flop requires cross-coupled CMOS transistor pairs. Such cross-coupled CMOS transistor pairs include interconnections between the gates of some transistors and the source or drain regions of other transistors. Such interconnections can be made through conductive patterns including troughs 900, 902 that are filled with a conductive layer of metal and/or a conductive compound of metal.

In another embodiment, the vias 800, 802 can be formed after the troughs 900, 902 and 904 are formed. However, in such case, lithography considerations would need to be altered. Also, a planarizing layer may need to be formed to cover the troughs before the vias are patterned. A bilayer includes such planarizing layer as a first layer used to planarize uneven topography, such first layer often being planarized by a specific planarization technique. The bilayer also includes a second layer including a photoresist, formed over the first layer. The photoresist then presents a substantially planar surface that is suitable for lithographic patterning.

Thereafter, as shown in FIG. 10A, a metallic conductive material is deposited in troughs 900, 902, and 904 to form the contacts 1010 and 1012 to transistors in the external region 350, a horizontally extending conductive pattern 1000 in the overlay region and horizontally extending conductive patterns 1002 and 1004 in the external region. The conductive pattern 1000 interconnects a bitline 600 with circuitry in the external region 350 such as a sense amplifier. Conductive patterns 1002 and 1003 are coupled to transistor gate contact 1010 and transistor source/drain contact 1012, respectively.

The metallic conductive material can include one or more metals and/or one or more conductive compounds of metals (for example, a metal silicide). The metal preferably includes metals such as tungsten and titanium which for which chemical vapor deposition techniques are available. However, other metals can be utilized as well, such as aluminum (AL), copper (cu), iridium (Ir), niobium (Nb), platinum (Pt), rhenium (Re), rhodium (Rh), ruthenium (Ru), tantalum (Ta), vanadium (V). Suitable metal compounds include, but are not limited to, one or more of the following: silicides of tungsten, titanium, cobalt and nickel, and nitrides of titanium and tantalum, as well as tantalum silicon nitride (TaSiN). Optionally, one or more adhesion promoting layers and/or one or more diffusion barrier layers may be provided which may include one or more of the nitrides indicated above.

Figure 10B:
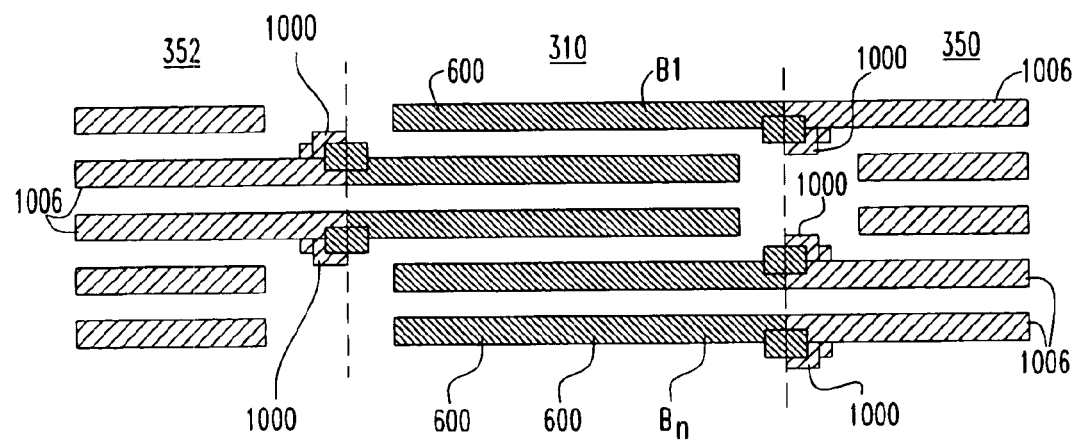

FIG. 10B is a top-down view illustrating resulting conductive lines, as patterned in the memory array region 310 and external regions 350 and 352. As illustrated in FIG. 10B, the upper layer 600 of the bitlines B1 . . . Bn extends horizontally across the memory array region 310 as a layer that is self-aligned to the bitline contacts (and lower bitline layer when present) in troughs that are defined by a single critical dimension mask. Alternating pairs of the bitlines B1 through Bn are connected to horizontally extending conductive lines 1006 in an external region 350 on the right side of the memory array region 310 by conductive patterns 1000. Alternating pairs of the bitlines B1 through Bn are connected to other horizontally extending conductive lines 1008 in the other external region 352 on the left side of the memory array region 310 by conductive patterns 1000 on that side. The horizontally extending conductive lines 1006 interconnect certain pairs of the bitlines to sense amplifiers (not shown) in external region 350. The horizontally extending conductive lines 1008 interconnect other pairs of the bitlines to sense amplifiers (not shown) in external region 352. Each interconnection between a horizontally extending conductive line and a sense amplifier includes contacts 1010 and 1012 to the gate conductor and substrate regions of transistors.

Figure 11:
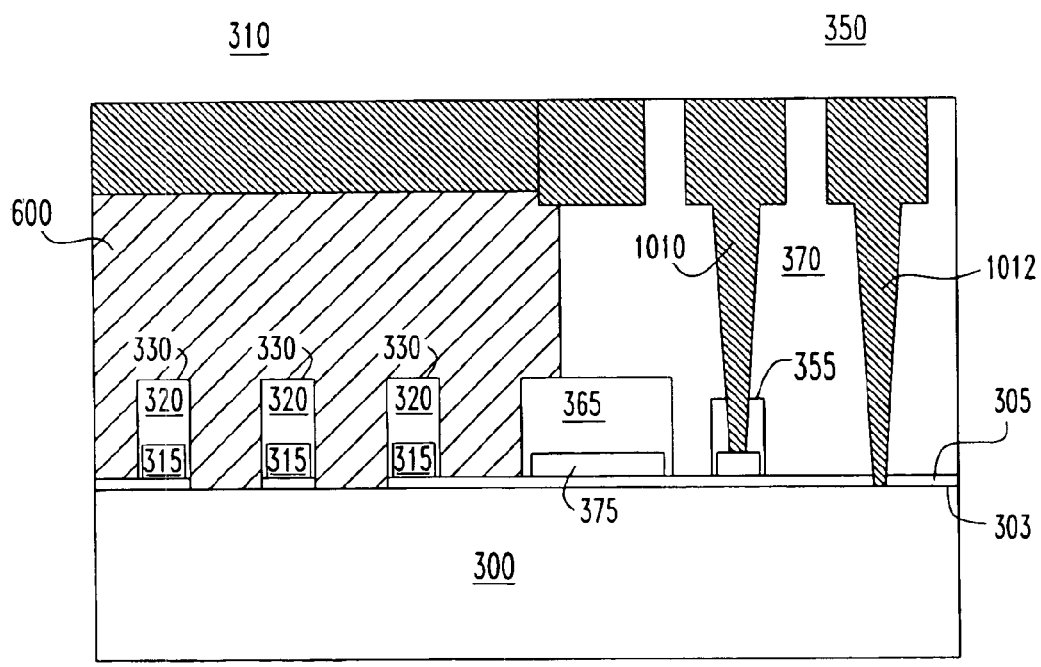
FIG. 11 is a cross-sectional view illustrating a structure resulting from processing according to an alternative embodiment of the invention.

FIG. 11 illustrates an alternative embodiment of the invention in which an isolating structure 365 is formed above the major surface 303 of the substrate, rather than below the major surface, as shown and described in the foregoing with respect to FIGS. 3 through 10A. In order to conserve processing steps, isolating structure 365 is preferably formed by the same process by which wordlines 330 of the memory array region and gate conductor 355 of the external region are formed. At minimum, the isolating structure includes a conductive line 375 formed in contact with the dielectric layer 305 formed on the major surface 303 of the substrate, an insulative material covering both the top and sidewalls of the conductive line 375.

It may be desirable to form such isolating structure 365 rather than the isolating structure 360 (FIG. 10A) for a number of reasons. The processing of the isolating structure 365 may be more easily integrated into other processing for forming the wordlines and gate conductors of the integrated circuit. Such isolation structure may also be selected for quality and consistency of results.

In yet another embodiment of the invention, an uninterrupted deposition process is used. By "uninterrupted" it is meant that a deposition process is used which is not interrupted by intervening etch and patterning steps. In such embodiment, the troughs 332 (FIG. 4), vias 800, 802 (FIG. 8) and troughs 900, 902 and 904 are all defined first. One or more planarized bilayers are utilized to pattern troughs 332, vias 800, 802 and/or troughs 900–904 when defining others of the troughs 332, vias 800, 802 and troughs 900–904. Then, a conductive material consisting essentially of at least one material selected from metals and conductive compounds of metals is deposited to fill the troughs and vias.

Figure 1A:
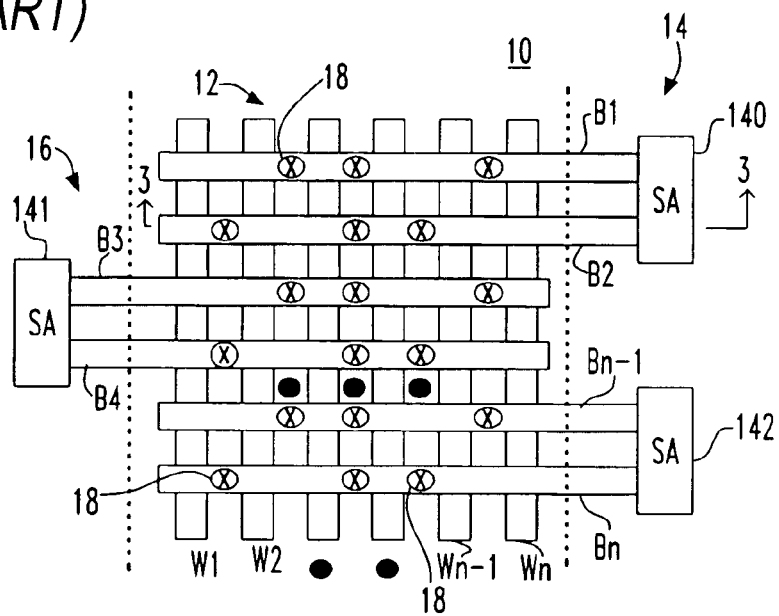
FIG. 1A is a top-down view illustrating the layout of a prior art dynamic random access memory array (DRAM).
Figure 1B:
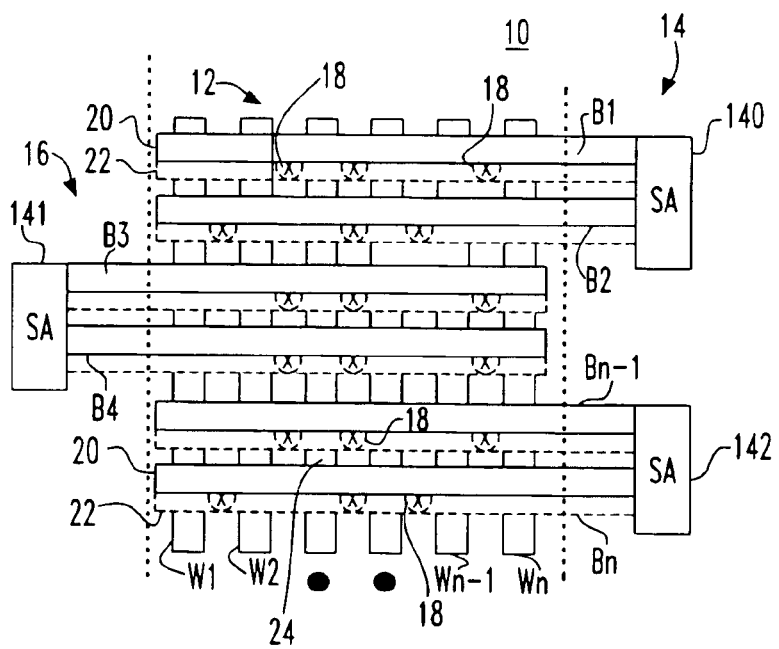
FIG. 1B is a top-down view illustrating overlay error between bitline contacts and metal bitline patterns of a prior art dynamic random access memory array (DRAM).
Figure 2:
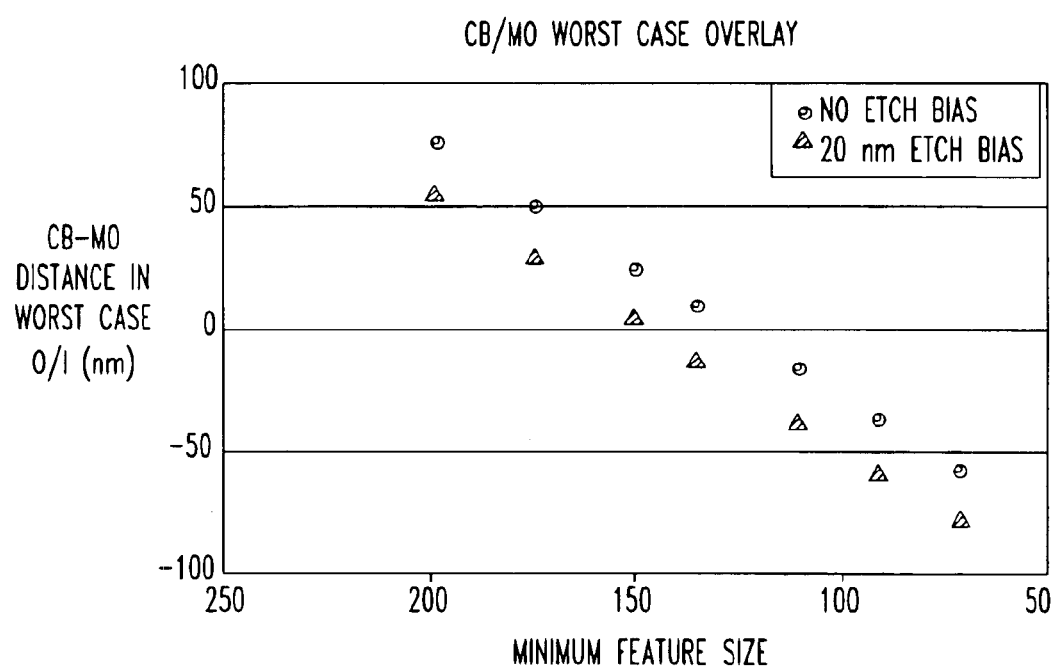
FIG. 2 is a diagram graphically illustrating relationship between worst case processing conditions and overlay error, as a function of reduction in the minimum feature size.

According to embodiments of the present invention, structure and method of forming bitlines of a memory cell array and conductive lines interconnecting transistors of an external region outside of the memory cell array are provided. The bitlines and the bitline contacts are formed in troughs patterned in a dielectric region covering the memory cell array according to a first critical dimension mask. By forming the bitlines and bitline contacts in troughs defined by the same critical dimension mask, no overlay error results in that process. Forming the bitlines in this way prevents short-circuiting between adjacent lines relative to bitline structures which have an M0 (upper metallic) layer which is defined by a separate mask from a CB (lower) layer including bitline contact, as described above relative to FIGS. 1A through 2.

A second critical dimension mask is then used to separately pattern horizontally oriented lines which interconnect external transistors in the external region outside of the memory array and interconnect the bitlines to external transistors. The separation of the lithography steps for forming the bitlines in the memory array region from those which form the conductive lines of the external region also allow the lithography conditions to be optimized separately for each region.

While the invention has been described relative to certain preferred embodiments thereof, those skilled in the art will recognize the many modifications and enhancements which can be made without departing from the true scope and spirit of the invention, which is limited only by the appended claims.

What is claimed is:

1. An integrated circuit comprising:
    a substrate having a single-crystal semiconductor region defining a major surface of said substrate;
    a plurality of first transistors having conduction channels disposed in a memory cell array region of said semiconductor region;
    a plurality of second transistors having conduction channels disposed in an external region of said semiconductor region outside of said memory cell array region;
    a dielectric region covering said first transistors and said second transistors, said dielectric region having a plurality of troughs, each said trough having a pair of vertical sidewalls, each said sidewall extending substantially in a single plane to said substrate;
    a plurality of bitline contacts disposed in said troughs, said bitline contacts including a plurality of conductive vias extending in a vertical direction normal to said major surface to contact said first transistors;
    a plurality of horizontally extending bitlines disposed in said troughs and conductively connected to said conductive vias, said bitlines extending over said memory cell array region in a horizontal direction substantially parallel to said major surface; and
    metallic conductive lines interconnecting said bitlines to said second transistors, said conductive lines differing from said bitlines in a patterned characteristic including at least one of horizontal width, vertical thickness, and placement relative to said bitlines.

2. The integrated circuit of claim 1 wherein said bitlines are interconnected to said conductive lines by a plurality of horizontally disposed conductive interconnections, said conductive interconnections differing from said bitlines in a pattern characteristic including at least one of horizontal width, vertical thickness, and placement relative to said bitlines.

3. The integrated circuit of claim 2 further comprising wordlines encapsulated by insulative material, wherein said conductive vias of said bitline contacts include borderless contacts disposed between said encapsulated wordlines.

4. The integrated circuit of claim 3 wherein said conductive vias of said bitline contacts include at least a first layer consisting essentially of polysilicon and said bitlines include at least a second layer consisting essentially of at least one material selected from the group consisting of metals and conductive compounds of metals.

5. The integrated circuit of claim 3 wherein said bitlines and said conductive vias of said bitline contacts consist essentially of at least one material selected from the group consisting of metals and conductive compounds of metals.

6. The integrated circuit of claim 5 wherein said conductive lines are broader than said bitlines where said conductive lines interconnect to said bitlines.

7. The integrated circuit of claim 6 wherein said conductive lines interconnect pairs of said bitlines to sense amplifiers located in a plurality of said external regions disposed beyond opposite edges of said memory cell array, wherein successive pairs of said bitlines are coupled to sense amplifiers located in alternating ones of said external regions.

8. The integrated circuit of claim 7 wherein said conductive interconnections are disposed over isolation structures, said isolation structures isolating said memory cell array region from said external regions.

* * * * *

UNITED STATES PATENT AND TRADEMARK OFFICE
CERTIFICATE OF CORRECTION

PATENT NO. : 6,870,211 B1  Page 1 of 1
APPLICATION NO. : 10/605590
DATED : March 22, 2005
INVENTOR(S) : Rama Divakaruni et al.

It is certified that error appears in the above-identified patent and that said Letters Patent is hereby corrected as shown below:

Title Page,

Item (73), Assignee, should read:

--International Business Machines Corporation, Armonk, NY (US) and Infineon Technologies AG, Munich, Germany (DE)--.

Signed and Sealed this

Twenty Second Day of April, 2008

JON W. DUDAS
*Director of the United States Patent and Trademark Office*